United States Patent [19]

Hayase et al.

[11] 4,437,959
[45] Mar. 20, 1984

[54] PHOTOPOLYMERIZABLE COMPOSITION BASED ON EPOXY COMPOUND

[75] Inventors: Shuzi Hayase, Kawasaki; Shuichi Suzuki, Yokohama, both of Japan

[73] Assignee: Tokyo Shibaura Denki Kabushiki Kaisha, Kawasaki, Japan

[21] Appl. No.: 421,733

[22] Filed: Sep. 23, 1982

[30] Foreign Application Priority Data

Sep. 30, 1981 [JP] Japan ................................ 56-153746

[51] Int. Cl.$^3$ .......................... C08F 2/50; C08G 59/68
[52] U.S. Cl. .................................... 204/159.11; 528/92
[58] Field of Search ..................... 204/159.11; 528/92; 556/436

[56] References Cited

U.S. PATENT DOCUMENTS

| | | | |
|---|---|---|---|
| 2,634,282 | 4/1953 | Sommer | 556/436 |
| 2,775,605 | 12/1956 | De Benneville et al. | 556/436 |
| 3,489,781 | 1/1970 | Wilkus | 556/436 |
| 3,708,296 | 1/1973 | Schlesinger . | |
| 4,009,128 | 2/1977 | Vanderberg | 528/92 |
| 4,081,276 | 3/1978 | Crivello . | |
| 4,086,091 | 4/1978 | Cella | 528/92 |
| 4,297,458 | 10/1981 | Stark | 528/92 |
| 4,322,513 | 3/1982 | Wada et al. | 528/92 |
| 4,324,873 | 4/1982 | Wada et al. | 528/92 |
| 4,335,367 | 6/1982 | Mitsui et al. | 528/92 |

OTHER PUBLICATIONS

Brook et al.; Journal Amer. Chem. Soc. 85, No. 6, Mar. 1963, pp. 832–833.
Brook et al.; Canadian Journal of Chem. 41, No. 9, Sep. 1963, pp. 2351–2356.
Brook et al.; Canadian Journal of Chem. 42, No. 1, Jan. 1964, pp. 298–304.
Brook et al.; Canadian Journal of Chem. 49, No. 19, May 1971, pp. 1622–1628.
J. V. Crivello et al., "Photoinitiated Cationic Polymerization by Dialkylphenacylsulfonium Salts," *J. of Polymer Science*, vol. 17, p. 2877, (1979).
A. G. Brook et al., "The Spectral and Chemical Properties of α-Silyl Ketones," *J. Am. Chem. Soc.*, vol. 82, p. 5102, (1960), [A. G. Brook, *J. Am. Chem. Soc.*, 91, 355, (1969)].
H. Bock et al., "d-Orbital Effects in Silicon-Substituted π-Electron Systems. XV. The Color of Silyl Ketones," *J. Am. Chem. Soc.*, 91:2, 355, (1969).
Chemical Abstracts, vol. 83, No. 20, Nov. 17, 1975), Columbus, Ohio, United States, T. Takeuchi, "Photo-Curable Resin Coating Compositions", p. 103, Abstract No. 165970c & JP-A-75-50441.

*Primary Examiner*—Melvyn I. Marquis
*Assistant Examiner*—A. H. Koeckert
*Attorney, Agent, or Firm*—Oblon, Fisher, Spivak, McClelland & Maier

[57] ABSTRACT

A photopolymerizable composition based on an epoxy compound contains as a curing catalyst a combination of an α-ketosilyl compound with an aluminum compound having at least one organic radical directly bonded to the aluminum atom, and further contains as a photosensitizer a benzophenone compound and/or a thioxanthone compound.

12 Claims, No Drawings

PHOTOPOLYMERIZABLE COMPOSITION BASED ON EPOXY COMPOUND

BACKGROUND OF THE INVENTION

I. Field of the Invention

The present invention relates to a photopolymerizable composition and, more particularly, to a photopolymerizable composition based on an epoxy compound.

II. Description of the Prior Art

Epoxy resins are frequently used as insulating materials or photoresist materials for electrical equipment. Epoxy resins are conventionally cured by heat. However, efforts have been recently made to photocure an epoxy resin from the viewpoints of energy conservation and workability.

A method of photocuring an epoxy resin is known which comprises denaturing the epoxy resin with a compound having a photopolymerizable group such as vinyl group, and photocuring the photopolymerizable group. However, the denatured epoxy resin which is cured by this method is inferior in heat resistance to the cured body of the original epoxy resin.

Another method of photocuring an epoxy resin is also known which comprises adding a photodecomposable catalyst to the epoxy resin and photodecomposing the catalyst to thereby cure the epoxy resin. Examples of such catalysts include complex catalysts such as $Ph_3S^+PF_6^-$ or $Ph_2X^+BF_4^-$ (where Ph is phenyl group and X is a halogen). Although these photodecomposable catalysts provide a cured epoxy resin which has excellent mechanical characteristics and heat resistance, ions of the components of these catalysts remain within the cured epoxy resin. These ions thus adversely affect the electrical characteristics of electrical equipment coated with such a cured epoxy resin, or cause corrosion.

SUMMARY OF THE INVENTION

It is, therefore, an object of the present invention to provide a photopolymerizable composition based on an epoxy resin, which may not have a degraded heat resistance after being cured, and which may not adversely affect electrical equipment when it is applied thereto.

The composition of the present invention is based on an epoxy compound, and contains as a curing catalyst a combination of an α-ketosilyl compound and an aluminum compound containing at least one organic radical directly bonded to the aluminum atom, and as a photosensitizer a benzophenone compound and/or a thioxanthone compound.

In order to increase the catalytic activity, the composition of the present invention may further contain an active proton-containing compound.

DETAILED DESCRIPTION OF THE PREFERRED EMBODIMENTS

The epoxy compound which is a basic component of the composition of the present invention is a compound which contains at least one epoxy group within the molecule and includes monomers, prepolymers or resins. Most of these epoxy compounds are commercially available.

Examples of such an epoxy compound include a simple epoxy compound such as cyclohexene oxide; bisphenol A type epoxy resin; bisphenol F type epoxy resin; phenol novolak type epoxy resin; an alicyclic epoxy resin; a heterocyclic-containing epoxy resin such as triglycidyl isocyanate or hydantoin epoxy resin; and aliphatic epoxy resin such as propylene glycol-diglycidyl ether or pentearythritol-polyglycidyl ether; hydrogenated bisphenol A type epoxy resin; an epoxy resin obtained by reaction of an aromatic, aliphatic or alicyclic carboxylic acid with epichlorohydrin; a glycidyl ether type epoxy resin which is a reaction product of ortho-allylphenol, a novolak compound and epichlorohydrin; a spiro-cyclic containing epoxy resin; a glycidyl ether type epoxy resin which is a reaction product of a diallylbisphenol compound having the allyl groups in the ortho positions to each of the hydroxyl groups of bisphenol A with epichlorohydrin; and the like.

As has been described earlier, the catalyst for the epoxy compound comprises a combination of an aluminum compound and an α-ketosilyl compound. The aluminum compound contains at least one organic radical which is directly bonded (by a covalent or coordinate bond) to the aluminum atom. The organic radical herein includes hydrocarbon groups and non-hydrocarbon group-containing hydrocarbon groups, examples of which include an alkyl group, an aryl group, a haloalkyl group, an alkoxyl group (e.g., methoxy, ethoxy or isopropoxy), an aryloxy group (e.g., phenoxy or p-methylphenoxy), an acyl group (e.g., acetyl or propionyl group), an acyloxyl group (e.g., acetyloxyl, propionyloxyl, isopropionyloxyl, butyryloxyl or stearoyloxyl), a β-dicarbonyl group (e.g., acetylacetone, trifluoroacetylacetone, hexafluoroacetylacetone, ethyl acetoacetate, salicylaldehyde, or diethyl malonate), a carbonyl-acyl group, and the like.

Examples of the aluminum compound include trimethoxy aluminum, triethoxy aluminum, triisopropoxy aluminum, triphenoxy aluminum, triparamethylphenoxy aluminum, isopropoxydiethoxy aluminum, tributoxy aluminum, triacetoxy aluminum, aluminum tristearate, aluminum tributylate, aluminum tripropionate, aluminum triisopropionate, tris(acetylacetonato)aluminum, tris(trifluoroacetylacetonato)aluminum, tris(hexafluoroacetylacetonato)aluminum, tris(ethylacetoacetato)aluminum, tris(salicylaldehydato)aluminum, tris(diethyl malonato)aluminum, tris(propylacetoacetato)aluminum, tris(butylacetato)aluminum, tris(dipivaloylmethanato)aluminum, diacetylacetonatodipivaloylmethanatoaluminum,

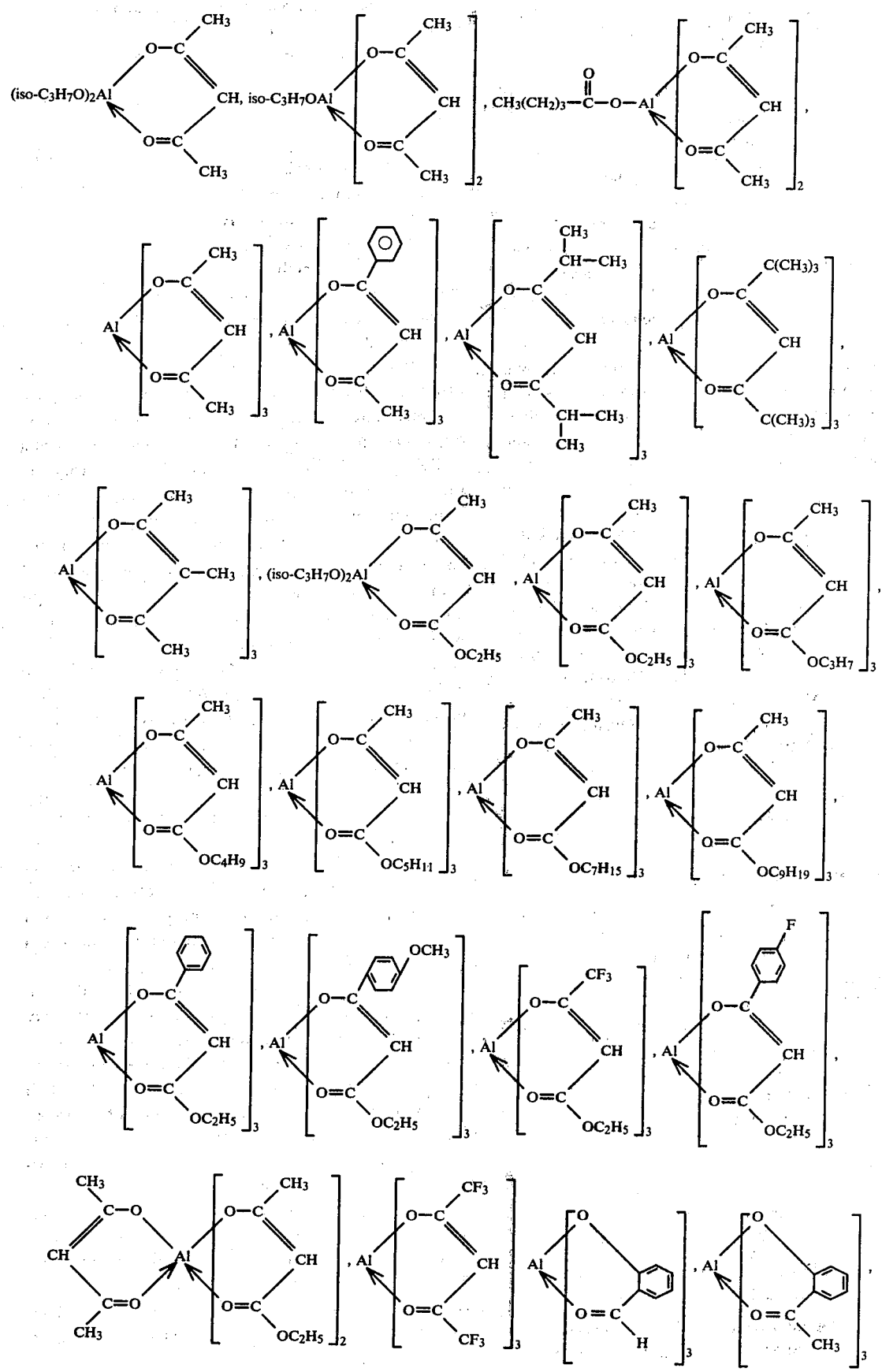

-continued

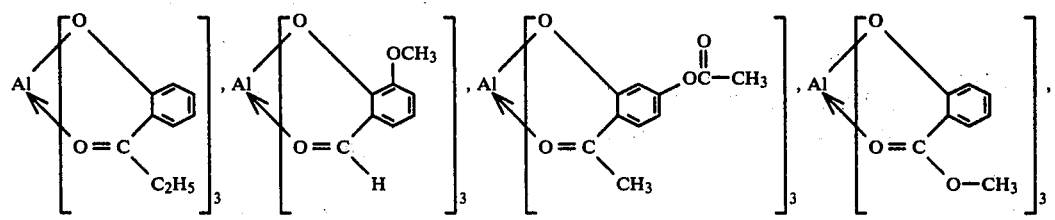

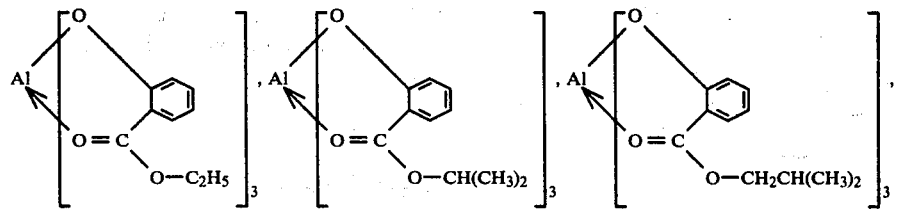

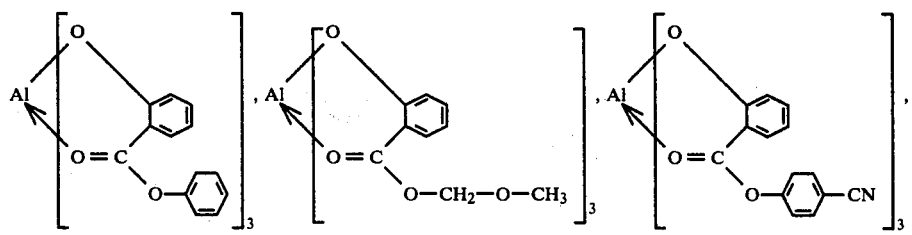

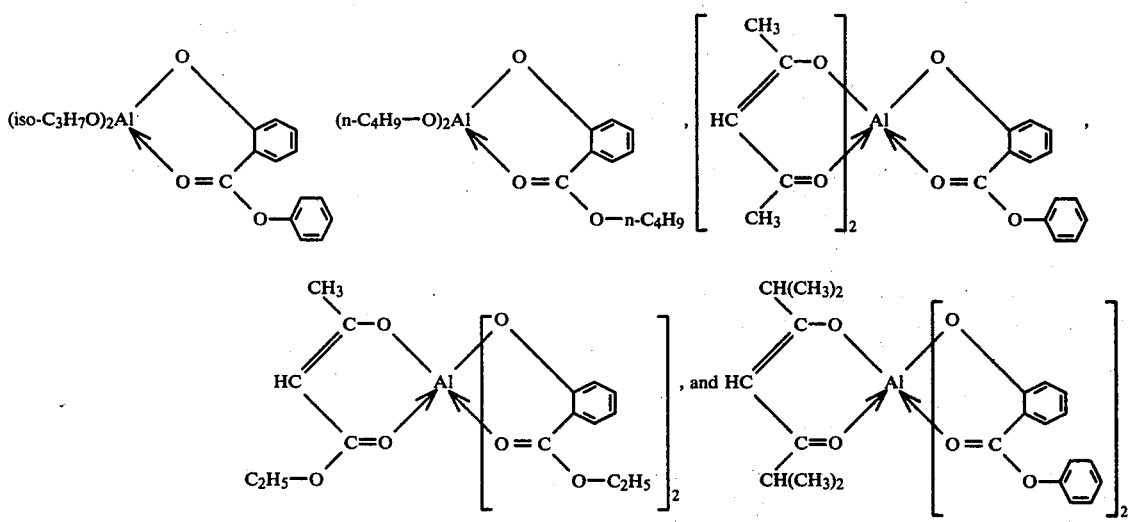

The aluminum compound may be used singly or in an admixture of two or more of these.

The aluminum compound is generally used in the amount of 0.001 to 5 parts by weight based on 100 parts by weight of the epoxy compound. If the amount of the aluminum compound is less than 0.001 parts by weight, the epoxy resin may not be sufficiently cured. Although the amount of the aluminum compound may exceed 5 parts by weight, the resultant composition may become costly and the electrical characteristics of the cured epoxy compound may be degraded.

The α-ketosilyl compound as another catalyst component can be represented by the general formula:

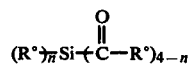

(where each R° is independently a hydrocarbon group (alkyl group or aryl group), or a substituted hydrocarbon group such as a halo-, nitro-, cyano- or alkoxy-substituted alkyl or aryl group, and n is an integer from 0 to 3).

Examples of the α-ketosilyl compound which may be used herein include:

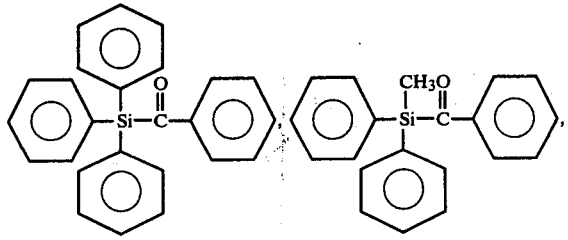

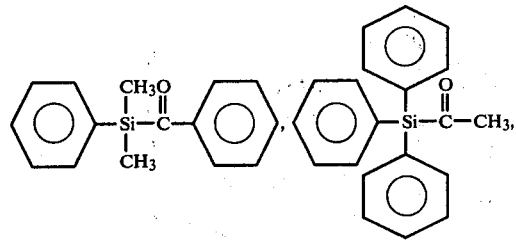

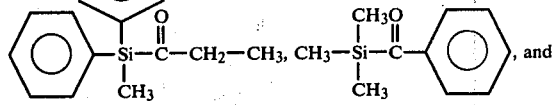

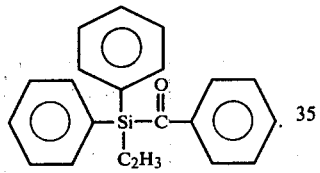

The α-ketosilyl compound may be used singly or in an admixture of two or more of these.

The α-ketosilyl compound is generally used in the amount of 0.1 to 10 parts by weight based on 100 parts by weight of the epoxy compound. If the amount of the α-ketosilyl compound used is less than 0.1 parts by weight, the epoxy resin may not be sufficiently cured. Although the amount of the α-ketosilyl compound may exceed 10 parts by weight, the resultant composition may become costly and the decomposed product thereof may adversely affect the cured epoxy composition.

A photosensitizer which absorbs light energy and transfers the adsorbed light energy to the catalyst to decompose it may be at least one member selected from the group consisting of benzophenone compounds and thioxanthone compounds. The benzophenone compound which may be used herein is represented by the general formula:

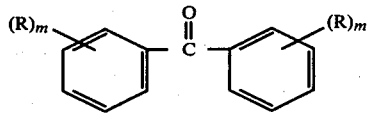

(In the formula each R is independently a halo group, an alkyl group, an aryl group, or a substituted alkyl or aryl group. The substituent group in the substituted alkyl group or aryl group may be a carboxylic acid ester group, an ether group, a thioether group, a ketone group, and nitro group, and each m is an integer from 0 to 5).

The thioxanthone compound which may be used herein is represented by the general formula:

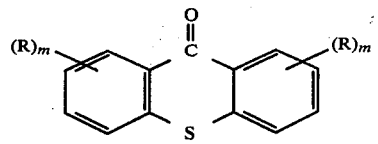

(where R and m have the same meanings as above).

Examples of the benzophenone compound which may be used herein include:

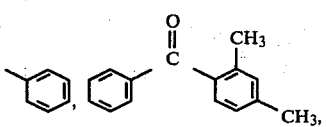

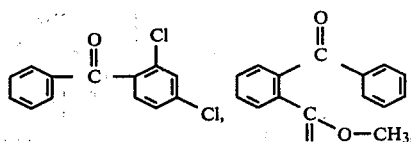

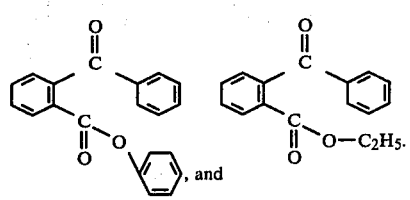

Examples of the thioxanthone compound which may be used herein include:

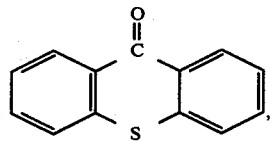

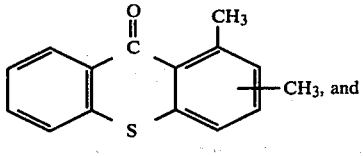

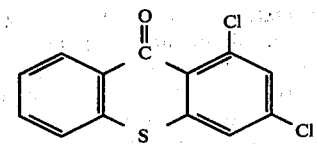

The photosensitizer as described above is used in the amount of 0.05 to 5 parts by weight based on 100 parts by weight of the epoxy resin. As has been described earlier, the photosensitizer absorbs light energy and transfers the absorbed light energy to the catalyst and is not itself subject to any chemical reaction (e.g., decomposition).

The composition of the present invention may further contain an active proton-containing compound. The active proton-containing compound stimulates the activity of the catalyst and thus promotes polymerization or curing speed of the epoxy compound.

Examples of the active proton-containing compound which may be used herein include: water; a $C_1-C_6$ alkanol such as methanol, ethanol or propanol; a $C_1-C_5$ alkanethiol such as methanethiol, ethanethiol, propanethiol, isopropanethiol or butanethiol; an aromatic thiol such as benzenethiol, p-methylbenzenethiol or p-methoxybenzenethiol; and the like.

The active proton-containing compound is used in the amount of 0.01 to 10 parts by weight based on 100 parts by weight of the epoxy compound. Since the active proton-containing compounds is included in the catalyst components by the photoreaction, it may not adversely affect the physical properties of the cured epoxy compound.

The composition of the present invention may further contain as a curing agent an acid anhydride or a phenolic compound (e.g., bisphenol A, bisphenol F, or bisphenol S, or phenols such as phenol, cresol, or a condensate of bisphenol A and formaldehyde). The composition of the present invention may further contain an unsaturated bond-containing compound such as an ethylenically unsaturated compound or imide compound.

The photopolymerizable composition of the present invention can be cured by ambient temperature photocuring, heat photocuring, or postcuring after photocuring. The wavelength of the light for photocuring is within the range of 180 to 600 nm although it may vary depending upon the composition of the resin. The light source may be a high-voltage mercury lamp, a carbon arc lamp, a xenon lamp, an argon glow discharge tube, a metal halide lamp or the like.

The cured product of the present invention has excellent heat resistance and electric insulating properties.

The present invention will now be described by way of its examples.

EXAMPLE 1

In a Pyrex polymerization tube were charged 2 cc of cyclohexene oxide, 0.036 g of triphenylsilyl phenyl ketone, 0.008 g of tris(normalpropylacetoacetato) aluminum, 0.15 g of benzophenone, and 0.002 g of water. These components were irradiated with ultraviolet (UV) rays for 13 minutes using a high-voltage mercury lamp (400 W). The reaction system was cured to provide polycyclohexene oxide at a degree of conversion of about 100%.

COMPARATIVE EXAMPLE 1

In a Pyrex polymerization tube were charged 2 cc of cyclohexene oxide, 0.04 g of triphenylsilyl phenyl ketone, and 0.002 g of water. These components were irradiated with UV rays for 20 hours using a high-voltage mercury lamp (400 W). However, a polymer was not obtained. When the composition used in Example 1 was left to stand at 40° C. without irradiation with UV rays, the polymer was not obtained.

EXAMPLE 2

In a Pyrex polymerization tube were charged 10 g of Chissonox 206 (trade name of an epoxy resin represented by the formula:

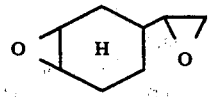

and manufactured by Chisso K. K.), 0.50 g of diphenylmethylsilyl phenyl ketone, 0.20 g of tris(ethylacetoacetato) aluminum, 0.50 g of a photosensitizer o-methoxycarbonylphenyl phenyl ketone having the formula:

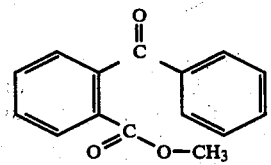

and 0.005 g of water. The mixture was irradiated with UV rays for 15 hours using a high-voltage mercury lamp (400 W). An excellent cured product was obtained.

EXAMPLE 3

A mixture was prepared from 50 g of Chissonox 221 (trade name of an epoxy resin represented by the formula:

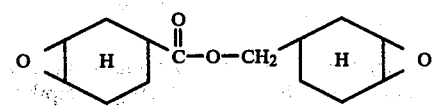

and manufactured by Chisso K. K.), 50 g of Chissonox 206, 2 g of triphenylsilyl phenyl ketone, 0.9 g of trisacetylacetonato aluminum, 1 g of a photosensitizer o-ethoxycarbonylphenyl phenyl ketone, 0.5 g of water and 1.5 g of ethyl alcohol. The mixture was flowed into a space defined by spacers of 1 mm thickness between quartz glass plates. Irradiation of the mixture with UV rays at 60° C. for 10 hours provided an excellent cured resin plate. The cured resin plate had a dielectric dissipation factor tan δ of 30% at 130° C. When the cured resin plate was further subjected to postcuring at 100° C. for 5 hours, the dielectric dissipation factor tan δ of 4.9% was obtained at 180° C.

COMPARATIVE EXAMPLE 2

In two grams of $BF_3$-monoethylamine were dissolved 100 g of Chissonox 221, and the resultant mixture was cured at 100° C. to provide a cured resin plate of 1 mm thickness. The cured resin plate had a dielectric dissipation factor tan δ far higher than 30% at 180° C.

EXAMPLE 4

A mixture was prepared from 100 g of Epikote 828 (trade name of an epoxy resin represented by the formula:

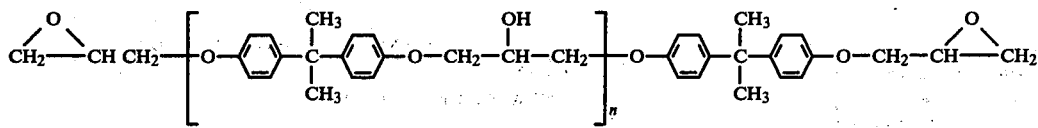

(where n is approximately 0), having an average molecular weight of approximately 380, and manufactured by Shell Chemicals), 100 g of Epikote 152 (trade name of an epoxy resin represented by the formula:

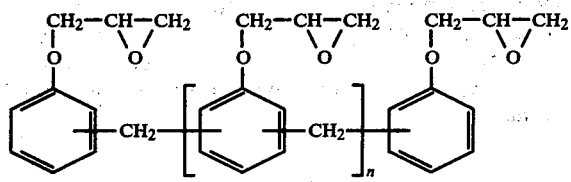

and manufactured by Shell Chemicals), 4 g of diphenylvinylsilyl phenyl ketone, 2 g of tris(normal-butylacetoacetato) aluminum, 1 g of water, 2 g of benzophenone, and 2 g of propyl alcohol. The mixture was flowed into a quartz glass tube and was irradiated with UV rays at 60° C. for 10 hours using a high-voltage mercury lamp. The mixture was found to be gelled.

EXAMPLE 5

A mixture was prepared from 50 g of Epikote 807 (trade name of a bisphenol F/epichlorohidrin type epoxy resin represented by the formula:

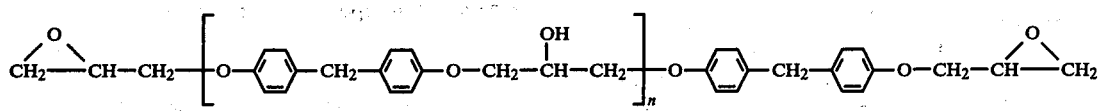

(where n is approximately 0) and manufactured by Shell Chemicals), 30 g of Epikote 828, 20 g of Epikote 1001 (trade name of an epoxy resin represented by the formula:

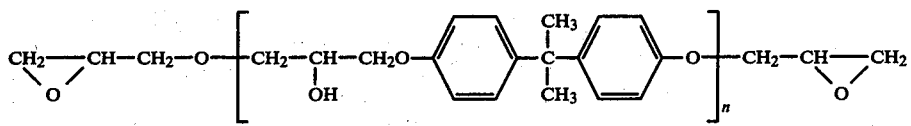

and manufactured by Shell Chemicals), 40 g of Epichlon B 570 (trade name of an acid anhydride represented by the formula:

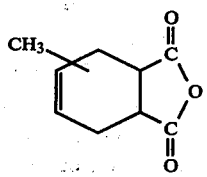

and manufactured by Dainippon Ink and Chemicals Inc.), 4 g of triphenylsilyl phenyl ketone, 3 g of ethyl alcohol, 3 g of tris(isobutylacetoacetato) aluminum, and 3 g of benzophenone. The resultant mixture was coated on an aluminum plate and was irradiated with UV rays from a high-voltage mercury lamp at 60° C. for 8 hours.

The mixture was found to be gelled. When the gelled mixture was postcured at 130° C. for 5 hours, an excellent cured resin plate was obtained. The cured resin plate had a dielectric dissipation factor tan δ of 4.5% at 130° C.

EXAMPLE 6

A mixture was prepared from 50 g of Chissonox 221, 20 g of Epikote 828, 3 g of triphenylsilyl methyl ketone, 0.5 g of tris(salicylaldehydato) aluminum, 3 g of isopropyl alcohol, and 2 g of benzophenone. The mixture was coated on a copper plate to a thickness of about 0.5 mm. The coating thus obtained was irradiated with UV rays for 2 hours using a metal halide lamp (80 W/cm) to provide an excellent cured resin plate. The cured resin plate had a dielectric dissipation factor tan δ of 4.1% at 180° C. after postcuring at 100° C. for 5 hours.

EXAMPLE 7

A composition similar to that prepared in Example 6 was prepared in the same manner except that thioxanthone was used in place of benzophenone. The composition was cured for 3 hours, and was postcured at 120° C. for 3 hours. The cured resin plate had a dielectric dissipation factor tan δ of 3.5% at 180° C.

EXAMPLE 8

A composition similar to that prepared in Example 6 was prepared in the same manner except that isopropanethiol was used in place of isopropyl alcohol, and the composition was cured in the same manner as in Example 6. The cured resin plate had a dielectric dissipation factor tan δ of 4.5% at 180° C.

As may be apparent from the Examples described above, the composition of the present invention can be readily cured by irradiation with light, and the resultant cured product has excellent electric characteristics such as a dielectric dissipation factor tan δ. The composition of the present invention is particularly suitable for electrical applications such as a resist material or an insulator for an electric equipment, particularly a coil.

What we claim is:

1. A photopolymerizable composition comprising: an epoxy compound;

a curing catalyst including at least one aluminum compound having at least one organic radical directly bonded to the aluminum atom, and at least one α-ketosilyl compound; and at least one photosensitizer selected from the group consisting of benzophenone compounds represented by a formula:

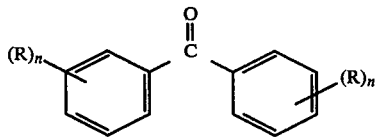

(where each R is independently a halo group, an alkyl group, an aromatic group or a substituted aromatic group, an n is an integer from 0 to 5), and thioxanthone compounds represented by a formula:

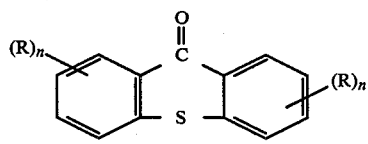

(where R and n have the same meanings as above).

2. The composition according to claim 1, wherein the aluminum compound is contained in an amount of 0.001 to 5 parts by weight based on 100 parts by weight of the epoxy compound.

3. The composition according to claim 2, wherein the aluminum compound is selected from the group consisting of trimethoxy aluminum, triethoxy aluminum, triisopropoxy aluminum, triphenoxy aluminum, triparamethylphenoxy aluminum, isopropoxydiethoxy aluminum, tributoxy aluminum, triacetoxy aluminum, aluminum tristearate, aluminum tributylate, aluminum tripropionate, aluminum triisopropionate, tris(acetylacetonato)aluminum, tris(trifluoroacetylacetonato)aluminum, tris(hexafluoroacetylacetonato(aluminum, tris(ethylacetoacetato)aluminum, tris(salicylaldehydato)aluminum, tris(diethyl malonato)aluminum, tris(propylacetoacetato)aluminum, tris(butylacetato)aluminum, tris(dipivaloylmethanato)aluminum, diacetylacetonatodipivaloylmethanatoaluminum,

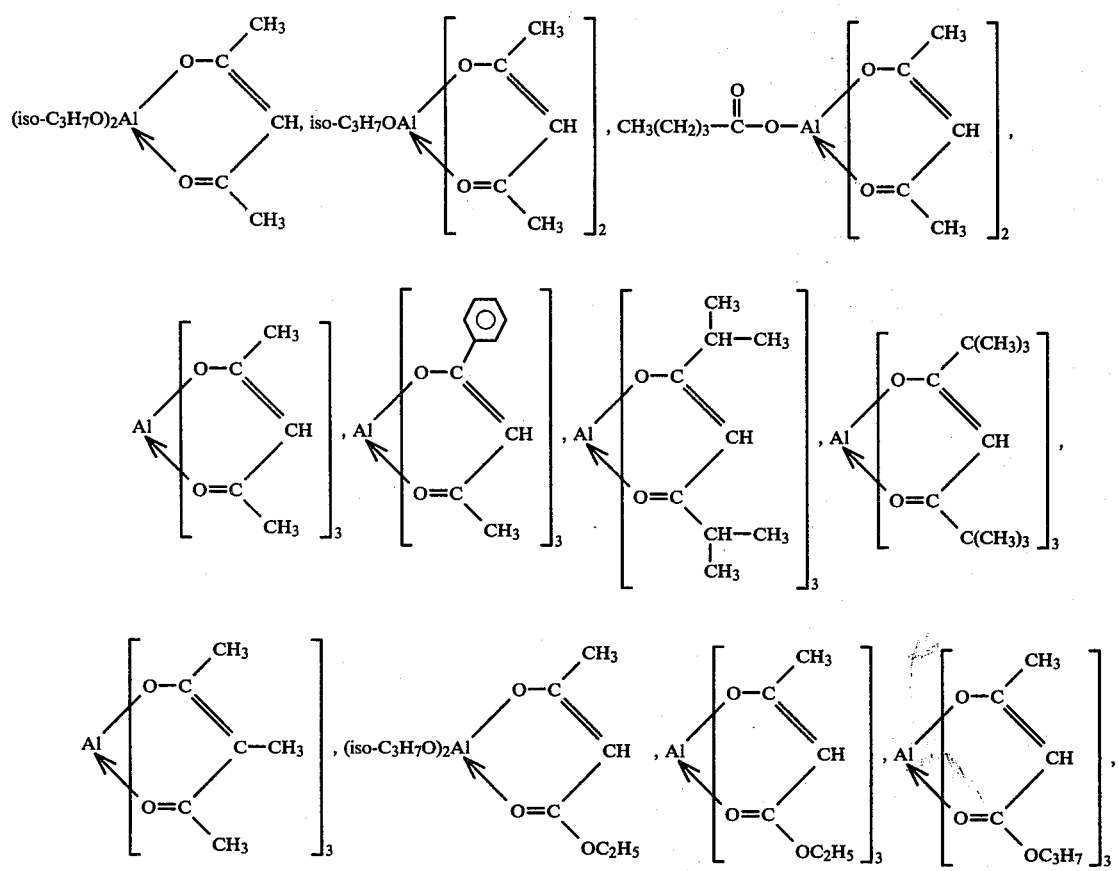

-continued
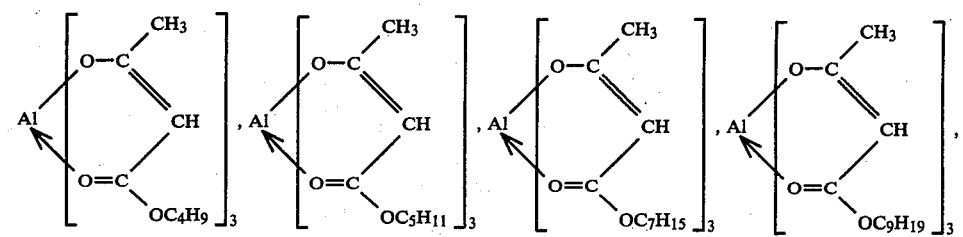
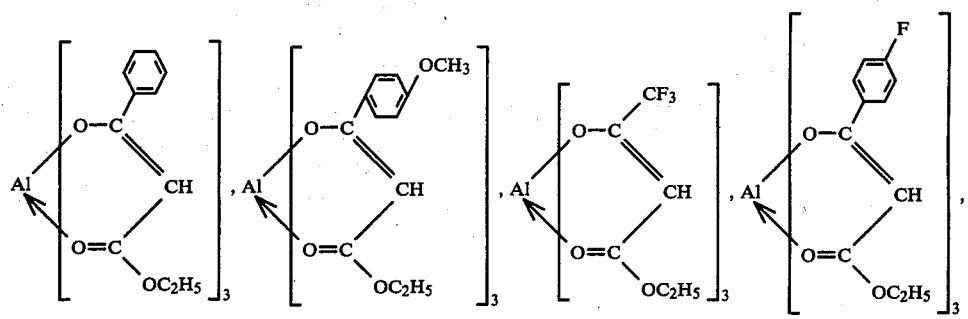
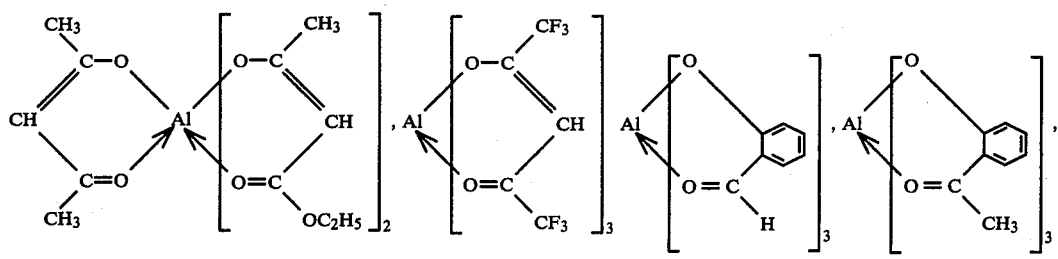
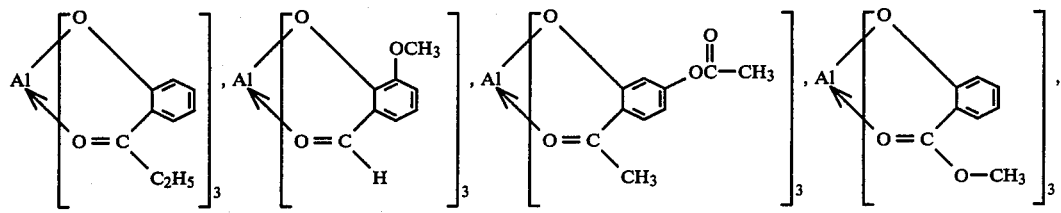
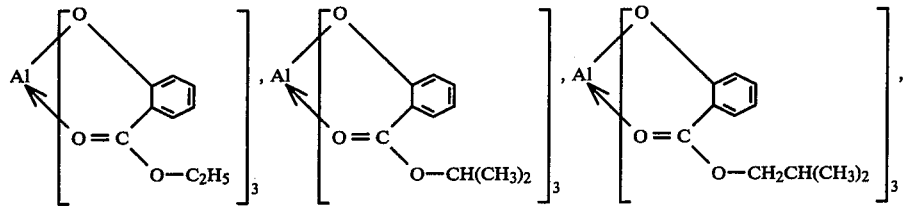
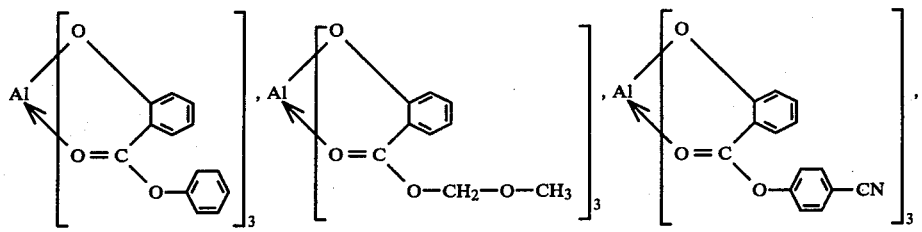

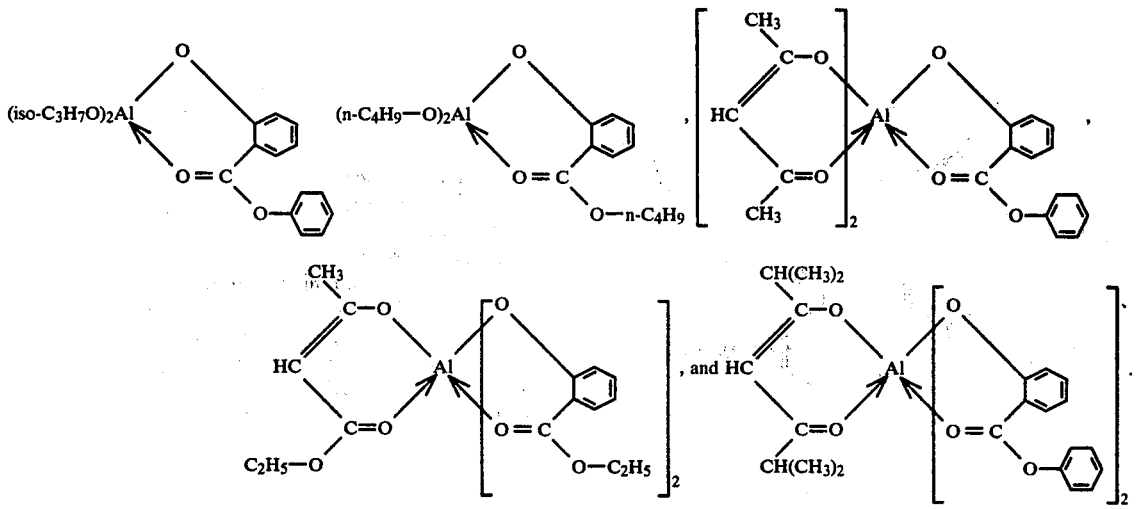

4. The composition according to claim 1, wherein the α-ketosilyl compound is contained in an amount of 0.1 to 10 parts by weight based on 100 parts by weight of the epoxy compound.

5. The composition according to claim 4, wherein the α-ketosilyl compound is represented by a formula:

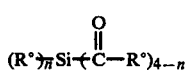

(where each R° is independently a hydrocarbon group or a substituted hydrocarbon group, and n is an integer from 0 to 3).

6. The composition according to claim 5, wherein the α-ketosilyl compound is selected from the group consisting of:

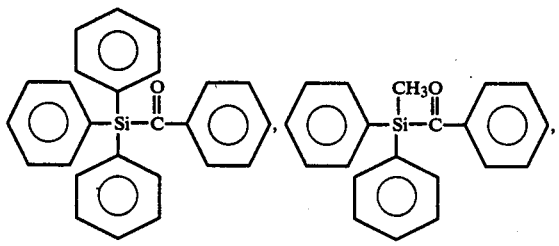

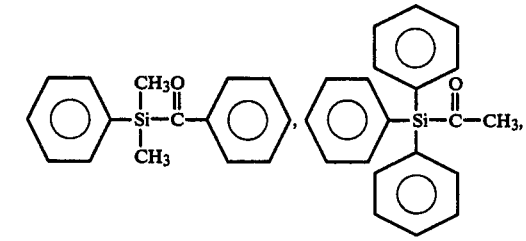

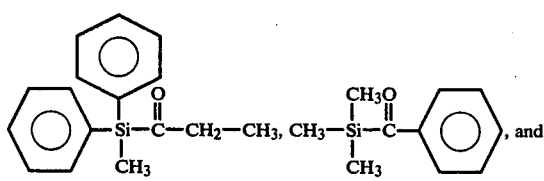

-continued

7. The composition according to claim 1, wherein the photosensitizer is contained in an amount of 0.05 to 5 parts by weight based on 100 parts by weight of the epoxy resin.

8. The composition according to claim 7, wherein the benzophenone compound is selected from the group consisting of:

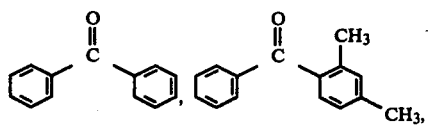

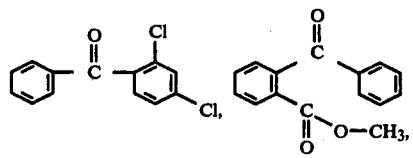

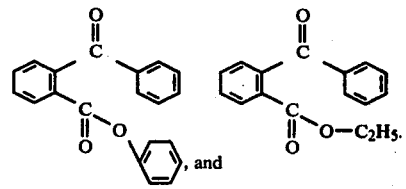

9. The composition according to claim 7, wherein the thioxanthone compound is a member selected from the group consisting of:

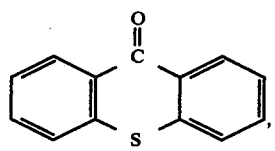

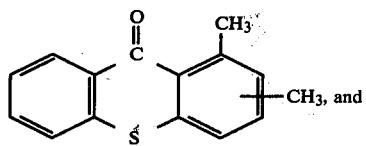

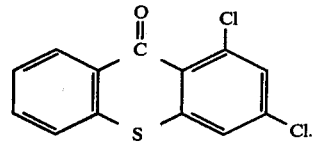

10. The composition according to any one of claims 1 to 9, further comprising an active proton-containing compound.

11. A composition according to claim 10, wherein the active proton-containing compound is contained in an amount of 0.01 to 10 parts by weight based on 100 parts by weight of the epoxy compound.

12. A composition according to claim 11, wherein the active proton-containing compound is selected from the group consisting of water, alcohol and thiol.

* * * * *